(12) United States Patent
Jung et al.

(10) Patent No.: US 12,293,089 B2
(45) Date of Patent: May 6, 2025

(54) SEMICONDUCTOR MEMORY DEVICE AND METHOD OF OPERATING THE SAME INCLUDING DETRAP OPERATION FOR LOWERING MEMORY CELL THRESHOLD VOLTAGES

(71) Applicant: SK hynix Inc., Icheon-si (KR)

(72) Inventors: Dong Jae Jung, Icheon-si (KR); Jae Woong Kim, Icheon-si (KR); Shin Won Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 210 days.

(21) Appl. No.: 18/077,727

(22) Filed: Dec. 8, 2022

(65) Prior Publication Data

US 2024/0004558 A1     Jan. 4, 2024

(30) Foreign Application Priority Data

Jun. 29, 2022    (KR) .......................... 10-2022-0080003

(51) Int. Cl.
| | |
|---|---|
| *G06F 3/06* | (2006.01) |
| *G11C 16/04* | (2006.01) |
| *G11C 16/16* | (2006.01) |

(52) U.S. Cl.
CPC .......... *G06F 3/0619* (2013.01); *G06F 3/0629* (2013.01); *G06F 3/0679* (2013.01); *G11C 16/0483* (2013.01); *G11C 16/16* (2013.01)

(58) Field of Classification Search
None
See application file for complete search history.

(56) References Cited

U.S. PATENT DOCUMENTS

| | | | | |
|---|---|---|---|---|
| 2012/0008415 A1* | 1/2012 | Park | .................... | G11C 16/0483 |
| | | | | 365/185.25 |
| 2019/0287625 A1* | 9/2019 | Hong | .................. | G11C 11/5635 |
| 2021/0104281 A1* | 4/2021 | Seo | ..................... | G11C 16/0433 |

FOREIGN PATENT DOCUMENTS

| | | |
|---|---|---|
| KR | 101605911 B1 | 3/2016 |
| KR | 1020190109122 A | 9/2019 |
| KR | 1020210039837 A | 4/2021 |

* cited by examiner

*Primary Examiner* — J. H. Hur
(74) *Attorney, Agent, or Firm* — William Park & Associates Ltd.

(57) ABSTRACT

A semiconductor memory device, and a method of operating the same, includes a memory block including a plurality of pages, a read and write circuit configured to apply a first bit line voltage to a selected bit line corresponding to a selected memory cell and apply a second bit line voltage having a potential lower than that of the first bit line voltage to an unselected bit line during detrap operation, a voltage generation circuit configured to generate a first set voltage, a second set voltage, and a pass voltage during the detrap operation, and an address decoder configured to apply the first set voltage to a selected word line corresponding to the selected page and apply the second set voltage having a potential higher than that of the first set voltage to unselected word lines, during the detrap operation.

26 Claims, 17 Drawing Sheets

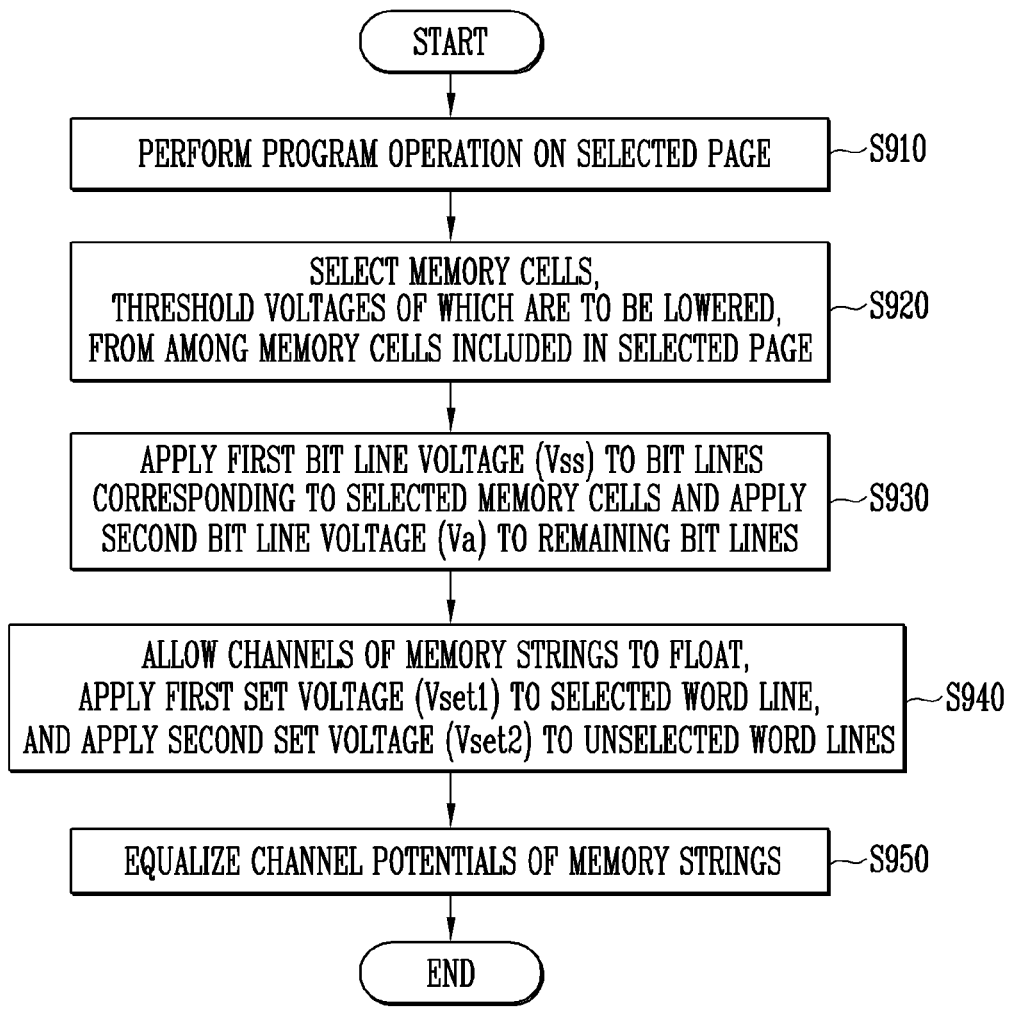
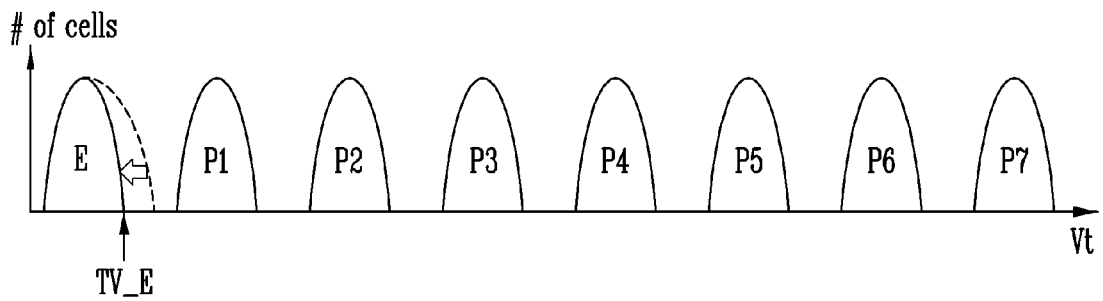

SEMICONDUCTOR MEMORY DEVICE AND METHOD OF OPERATING THE SAME INCLUDING DETRAP OPERATION FOR LOWERING MEMORY CELL THRESHOLD VOLTAGES

CROSS-REFERENCE TO RELATED APPLICATION

The present application claims priority under 35 U.S.C. § 119(a) to Korean patent application number 10-2022-0080003, filed on Jun. 29, 2022, in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Recently, the paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device for portable electronic devices.

A data storage device using a semiconductor memory device is advantageous in that, because there is no mechanical driving part, stability and durability are excellent, an information access speed is high, and power consumption is low. The data storage device, as examples of the memory system having such advantages, includes a universal serial bus (USB) memory device, memory cards having various interfaces, a solid state drive (SSD), etc.

Semiconductor memory devices are classified as volatile memory devices or nonvolatile memory devices.

Such a nonvolatile memory device has comparatively low write and read speed, but retains data stored therein even when the supply of power is interrupted. Therefore, the nonvolatile memory device is used to store data to be retained regardless of whether power is supplied. Representative examples of nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), and ferroelectric RAM (FRAM). The flash memory is classified as NOR type or NAND type.

SUMMARY

Various embodiments of the present disclosure are directed to a semiconductor memory device that is capable of improving data reliability and a method of operating the semiconductor memory device.

In accordance with an embodiment of the present disclosure, a semiconductor memory device may include: a memory block including a plurality of pages; a read and write circuit configured to apply a first bit line voltage to a selected bit line corresponding to a selected memory cell, among a plurality of bit lines of the memory block, and apply a second bit line voltage having a potential lower than a potential of the first bit line voltage to an unselected bit line, among the plurality of bit lines, during a detrap operation on at least one memory cell included in a page selected from among the plurality of pages; a voltage generation circuit configured to generate a first set voltage, a second set voltage, and a pass voltage during the detrap operation; and an address decoder configured to apply the first set voltage to a selected word line corresponding to the selected page and apply the second set voltage having a potential higher than a potential of the first set voltage to unselected word lines, during the detrap operation.

In accordance with the present disclosure is a method operating a semiconductor memory device. The method may include applying a first bit line voltage to a selected bit line corresponding to at least one memory cell selected from among a plurality of memory cells included in a selected page, and applying a second bit line voltage lower than the first bit line voltage to an unselected bit line, allowing channels of a plurality of memory strings respectively corresponding to the plurality of memory cells to float, and boosting the channels of the plurality of memory strings by applying a first set voltage to a selected word line corresponding to the selected page and by applying a second set voltage having a potential higher than a potential of the first set voltage to unselected word lines corresponding to unselected pages.

In accordance with the present disclosure is a method of operating a semiconductor memory device. The method may include performing a program operation on a page selected from among a plurality of pages, and performing a detrap operation on the selected page, wherein the detrap operation includes applying a first bit line voltage to a selected bit line corresponding to memory cells selected from among a plurality of memory cells included in the selected page, and applying a second bit line voltage lower than the first bit line voltage to an unselected bit line, allowing channels of a plurality of memory strings respectively corresponding to the plurality of memory cells to float, and boosting the channels of the plurality of memory strings by applying a first set voltage to a selected word line corresponding to the selected page and by applying a second set voltage having a potential higher than a potential of the first set voltage to unselected word lines corresponding to unselected pages.

In accordance with the present disclosure is a method of operating a memory device. The method may include performing a first program operation on a selected page, performing a detrap operation on the selected page, and performing a second program operation on the selected page, wherein the detrap operation includes applying a first bit line voltage to a selected bit line corresponding to memory cells selected from among a plurality of memory cells included in the selected page, and applying a second bit line voltage lower than the first bit line voltage to an unselected bit line, allowing channels of a plurality of memory strings respectively corresponding to the plurality of memory cells to float, and boosting the channels of the plurality of memory strings by applying a first set voltage to a selected word line corresponding to the selected page and by applying a second set voltage having a potential higher than a potential of the first set voltage to unselected word lines corresponding to unselected pages.

BRIEF DESCRIPTION OF THE DRAWINGS

FIG. 9 is a flowchart illustrating the operation of a semiconductor memory device according to an embodiment of the present disclosure.

FIGS. 10A to 10C are diagrams illustrating threshold voltage distributions of memory cells for describing various embodiments in which a target program state is set.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Hereinafter, the present disclosure will be described in detail based on embodiments of the present disclosure with reference to the accompanying drawings. Below, embodiments of the present disclosure will be described in detail with reference to the attached drawings.

Figure 1:
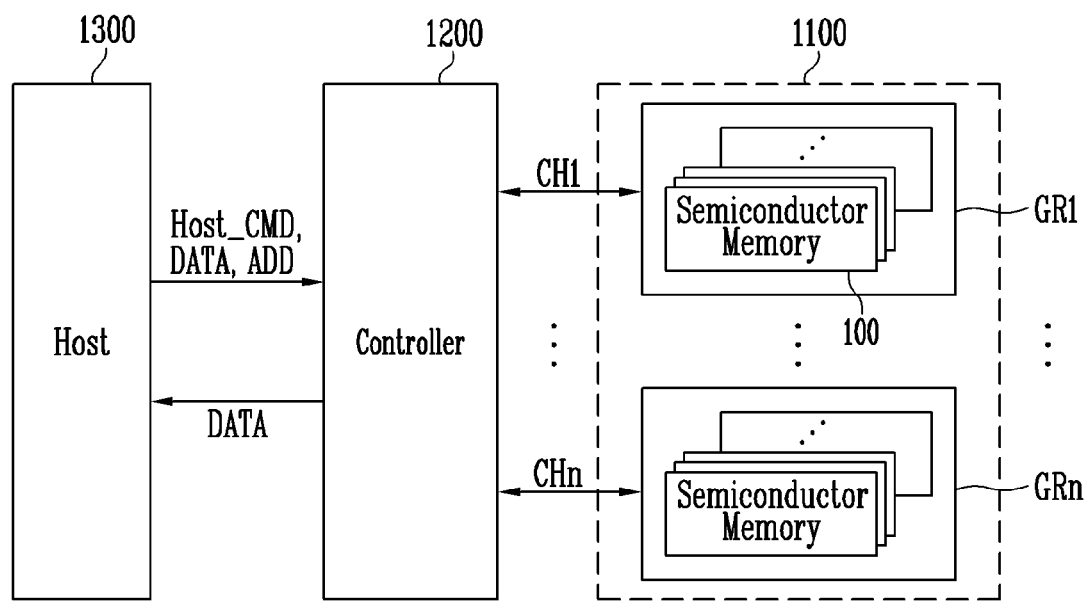
FIG. 1 is a block diagram illustrating a memory system including a semiconductor memory device according to an embodiment of the present disclosure.

FIG. 1 is a block diagram illustrating a memory system including a semiconductor memory device according to an embodiment of the present disclosure.

Referring to FIG. 1, a memory system 1000 may include a memory device 1100, a controller 1200, and a host 1300. The memory device 1100 may include a plurality of semiconductor memory devices (also referred to as semiconductor memories) 100. The plurality of semiconductor memories 100 may be divided into a plurality of groups GR1 to GRn. In an embodiment of the present disclosure, although the host 1300 is illustrated and described as being included in the memory system 1000, the memory system 1000 may be configured to include only the controller 1200 and the memory device 1100, with the host 1300 being disposed outside the memory system 1000.

In FIG. 1, it is illustrated that the plurality of groups GR1 to GRn of the memory device 1100 communicate with the controller 1200 through first to n-th channels CH1 to CHn, respectively. Each semiconductor memory 100 will be described in detail later with reference to FIG. 2.

The groups GR1 to GRn may individually communicate with the controller 1200 through one common channel. The controller 1200 may control the plurality of semiconductor memories 100 of the memory device 1100 through the plurality of channels CH1 to CHn.

In an embodiment of the present disclosure, each semiconductor memory 100 may perform a detrap operation of lowering threshold voltages of memory cells selected from among memory cells included in a plurality of memory strings.

In an embodiment of the present disclosure, the semiconductor memory 100 may perform a program operation on a page basis, and thereafter perform a detrap operation of lowering the threshold voltages of memory cells having high threshold voltages, among memory cells in a specific state included in a page on which the program operation has been completed. The specific state may be at least one of an erase state and a plurality of program states.

In an embodiment of the present disclosure, the semiconductor memory 100 may perform a first program operation so that the memory cells have threshold voltages lower than a target threshold voltage, and may then perform a detrap operation of lowering the threshold voltages of the memory cells after the first program operation is completed. Thereafter, a second program operation of programming the memory cells so that the memory cells have threshold voltages equal to or higher than the target threshold voltage may be performed.

The controller 1200 is coupled between the host 1300 and the memory device 1100. The controller 1200 may access the memory device 1100 in response to a request from the host 1300. For example, the controller 1200 may control a read operation, a program operation, an erase operation, and a background operation of the memory device 1100 in response to a host command Host_CMD received from the host 1300. The host 1300 may transmit an address ADD and data to be programmed DATA, together with the host command Host_CMD, during a program operation, and may transmit an address ADD, together with the host command Host_CMD, during a read operation. During a program operation, the controller 1200 may transmit the command corresponding to the program operation and the data to be programmed DATA to the memory device 1100. During a read operation, the controller 1200 may transmit the command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may include portable electronic devices, such as a computer, a personal digital assistant (PDA), a portable multimedia player (PMP), an MP3 player, a camera, a camcorder, and a mobile phone. The host 1300 may request the program operation, the read operation, the erase operation, etc. of the memory system 1000 through the host command Host_CMD. The host 1300 may transmit the host command Host_CMD corresponding to the program operation, the data DATA, and the address ADD to the controller 1200 so as to perform the program operation of the memory device 1100, and may transmit the host command Host_CMD corresponding to the read operation and the address ADD to the controller 1200 so as to perform the read operation. Here, the address ADD may be the logical address of the data.

The controller 1200 and the memory device 1100 may be integrated into a single semiconductor memory device. In an embodiment, the controller 1200 and the memory device 1100 may be integrated into a single semiconductor memory device to form a memory card. For example, the controller 1200 and the memory device 1100 may be integrated into a single semiconductor memory device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), or a universal flash storage (UFS).

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an example embodiment, the memory device 1100 or the memory system 1000 may be mounted as various types of packages. For example, the memory device 1100 or the memory system 1000 may be packaged and mounted in a type such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline (TSOP), system in package (SIP), multi-chip package (MCP), wafer-level fabricated package (WFP), or wafer-level processed stack package (WSP).

Figure 2:
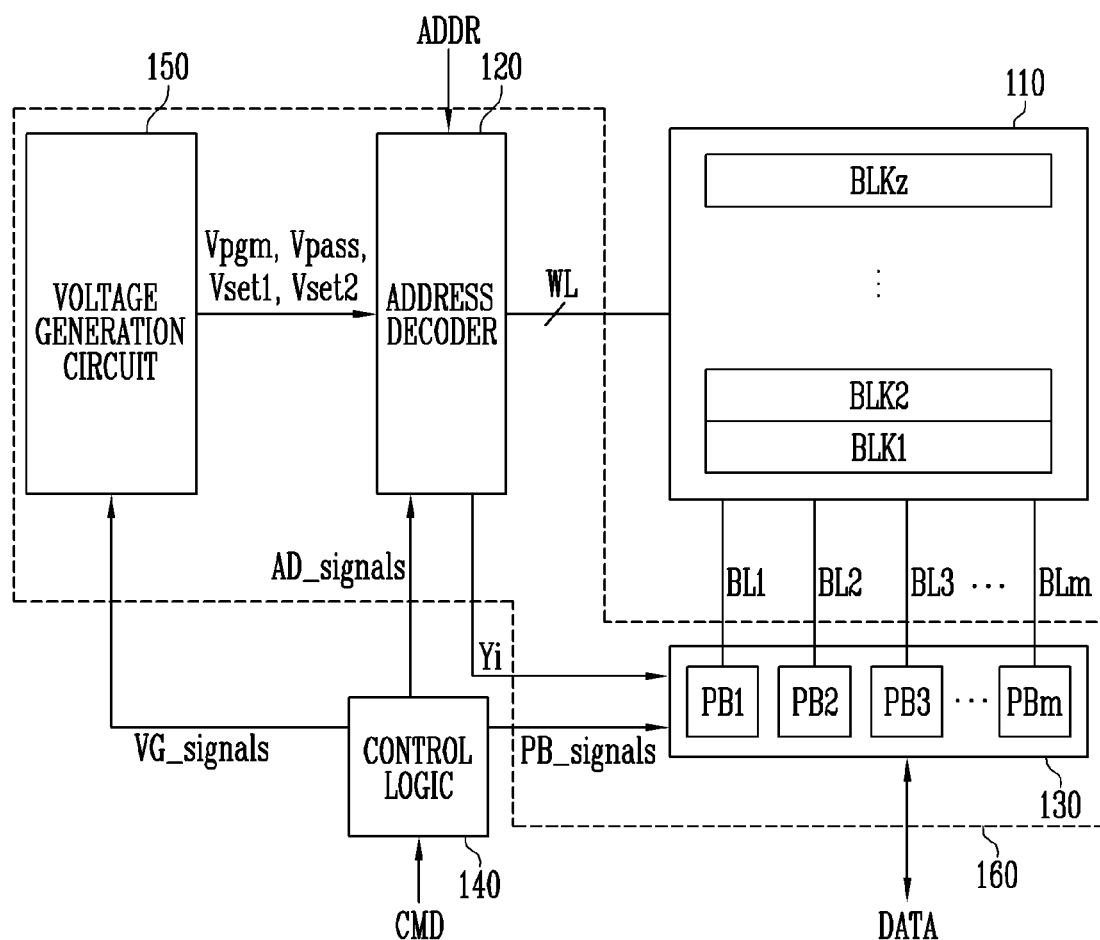
FIG. 2 is a diagram illustrating the semiconductor memory device included in a memory device of FIG. 1.

FIG. 2 is a diagram illustrating the semiconductor memory device included in the memory device of FIG. 1.

Referring to FIG. 2, the semiconductor memory device (also referred to as semiconductor memory) 100 may include a memory cell array 110, an address decoder 120, a read and write circuit 130, control logic 140, and a voltage generation circuit 150. The address decoder 120, the read and write circuit 130, and the voltage generation circuit 150 may be defined as a peripheral circuit 160 which performs a program operation and a read operation on the memory cell array 110.

The memory cell array 110 includes a plurality of memory blocks BLK1 to BLKz. The plurality of memory blocks BLK1 to BLKz are coupled to the address decoder 120 through word lines WL. The memory blocks BLK1 to BLKz are coupled to the read and write circuit 130 through bit lines BL1 to BLm. Each of the memory blocks BLK1 to BLKz may include a plurality of memory cells. In an embodiment, the plurality of memory cells may be nonvolatile memory cells. Memory cells coupled to one word line, among the plurality of memory cells, may be defined as one page. That is, each of the memory blocks BLK1 to BLKz included in the memory cell array 110 may be composed of a plurality of pages.

Each of the memory blocks BLK1 to BLKz of the memory cell array 110 includes a plurality of memory strings. Each of the memory strings may include a drain select transistor, a plurality of memory cells, and a source select transistor, which are coupled in series between a corresponding bit line and a source line. Further, each of the plurality of memory strings may include pass transistors between the source select transistor and the memory cells and between the drain select transistor and the memory cells. The memory cell array 110 will be described in detail later.

The address decoder 120 is coupled to the memory cell array 110 through the word lines WL. The address decoder 120 may be operated in response to address decoder control signals AD_signals generated by the control logic 140. The address decoder 120 receives addresses ADDR through an input/output buffer (not shown) provided in the semiconductor memory 100.

During a program operation, the address decoder 120 may decode a row address, among the received addresses ADDR, and may apply a plurality of operating voltages including a program voltage Vpgm, a pass voltage Vpass, a first set voltage Vset1, and a second set voltage Vset2, which are generated by the voltage generation circuit 150, to the plurality of memory cells of the memory cell array 110 depending on the decoded row address. Further, the address decoder 120 may apply a drain select line voltage and a source select line voltage, which are generated by the voltage generation circuit 150, to the drain select transistors and source select transistors of the memory cell array 110.

The address decoder 120 may apply a first set voltage Vset1 having a negative potential to a selected word line corresponding to a selected page and apply a second set voltage Vset2 having a positive potential to the remaining word lines, that is, unselected word lines, during a detrap operation performed on selected memory cells, among memory cells included in the selected page. Here, the address decoder 120 may control the corresponding drain select transistor and the corresponding source select transistor to be in a turn-off state by applying a turn-off voltage (e.g., a ground voltage) to a drain select line and a source select line of a selected memory block. That is, the address decoder 120 may control each of the memory cells included in the selected memory block to float.

The address decoder 120 may decode a column address, among the received addresses ADDR. The address decoder 120 may transmit a decoded column address Yi to the read and write circuit 130.

The addresses ADDR received in a program operation include a block address, a row address, and a column address. The address decoder 120 may select one memory block and one word line according to the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBm. The plurality of page buffers PB1 to PBm are coupled to the memory cell array 110 through the bit lines BL1 to BLm. During a program operation, each of the page buffers PB1 to PBm may temporarily store data DATA to be programmed, received from the controller 1200 of FIG. 1, and may control the potential level of a corresponding one of the bit lines BL1 to BLm in accordance with the temporarily stored data DATA. During a verify operation, each of the page buffers PB1 to PBm may perform the verify operation by sensing the potential or current amount of the corresponding one of the bit lines BL1 to BLm.

During a detrap operation, the read and write circuit 130 may apply a first bit line voltage to selected bit lines corresponding to the selected memory cells, among the bit lines BL1 to BLm, and may apply a second bit line voltage to the remaining bit lines, that is, unselected bit lines, among the bit lines BL1 to BLm. The first bit line voltage may be a ground voltage, and the second bit line voltage may be a set voltage having a negative potential.

The read and write circuit 130 may be operated in response to page buffer control signals PB_signals output from the control logic 140.

In an example embodiment, the read and write circuit 130 may include page buffers (or page registers), a column select circuit, etc.

The control logic 140 may be coupled to the address decoder 120, the read and write circuit 130, and the voltage generation circuit 150. The control logic 140 may receive a command CMD through an input/output buffer (not illustrated) of the semiconductor memory 100. The control logic 140 may control the overall operation of the semiconductor memory 100 in response to the command CMD. For example, the control logic 140 may receive a command CMD corresponding to a program operation, and may generate and output address decoder control signals AD_signals for controlling the address decoder 120, page buffer control signals PB_signals for controlling the read and write circuit 130, and voltage generation circuit control signals VG_signals for controlling the voltage generation circuit 150 in response to the received command CMD.

The control logic 140 according to an embodiment of the present disclosure may control the peripheral circuit 160 to perform a detrap operation of lowering the threshold voltage of at least one memory cell selected from among the plurality of memory cells included in the selected page. The control logic 140 according to an embodiment of the present disclosure may control the peripheral circuit 160 such that, after the program operation on the selected page is completed, a detrap operation is performed on memory cells having threshold voltages higher than a preset threshold voltage, among memory cells corresponding to a specific state in the plurality of memory cells included in the selected page, or on memory cells having threshold voltages higher than a plurality of preset threshold voltages respectively corresponding to the plurality of program states. The control logic 140 according to an embodiment of the present disclosure may control the peripheral circuit 160 to sequentially perform a first program operation of programming memory cells included in the selected page to a pre-program state having a threshold voltage distribution lower than a target threshold voltage distribution, a detrap operation of lowering the threshold voltages of the memory cells included in the selected page, and a second program operation of programming the memory cells included in the selected page to the target threshold voltage distribution. The control logic 140 may be implemented as hardware, software, or a combination of hardware and software. For example, the control logic 140 may be a control logic circuit operating in accordance with an algorithm and/or a processor executing control logic code.

During a program operation, the voltage generation circuit 150 may generate a plurality of operating voltages, including the program voltage Vpgm and the pass voltage Vpass, under the control of the voltage generation circuit control signals VG_signals output from the control logic 140, and may output the generated operating voltages to the address decoder 120. Furthermore, during a detrap operation, the voltage generation circuit 150 may generate the first set voltage Vset1 to be applied to a selected word line and the second set voltage Vset2 to be applied to unselected word lines, and may transmit the generated voltages to the address decoder 120. For example, the first set voltage Vset1 may have a potential lower than that of the second set voltage Vset2. For example, the first set voltage Vset1 may have a negative potential, and the second set voltage Vset2 may have a positive potential. For example, the first set voltage Vset1 may be −3.5 V, and the second set voltage Vset2 may be 8.5 V.

Figure 3:
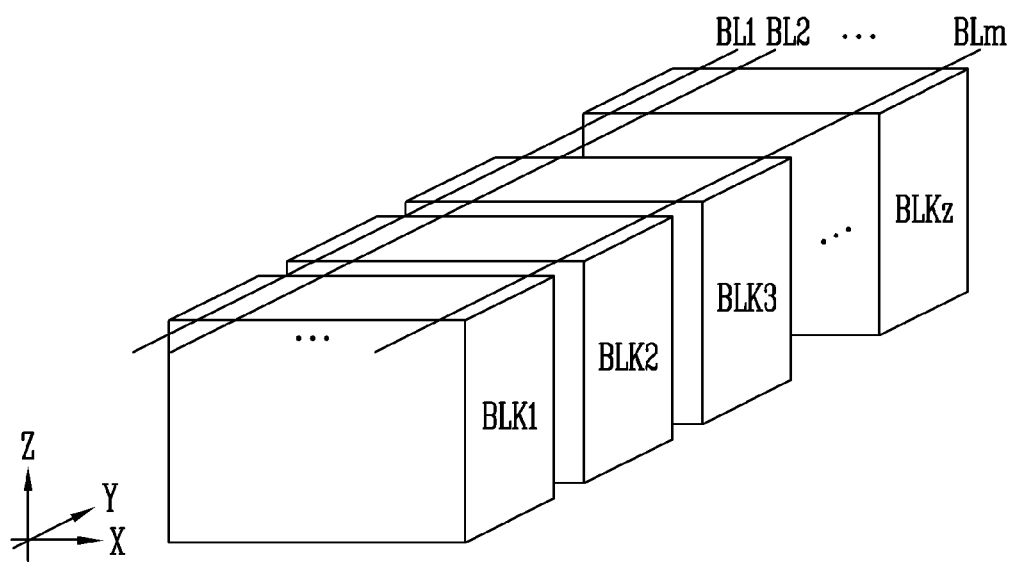
FIG. 3 is a diagram illustrating memory blocks having a 3D structure.

FIG. 3 is a diagram illustrating memory blocks having a 3D structure.

Referring to FIG. 3, the memory blocks BLK1 to BLKz having a 3D structure may be arranged to be spaced apart from each other along a direction Y in which bit lines BL1 to BLm extend. For example, the first to z-th memory blocks BLK1 to BLKz may be arranged to be spaced apart from each other along a second direction Y, and each of the first to z-th memory blocks may include a plurality of memory cells stacked along a third direction Z. The configuration of any one of the first to z-th memory blocks BLK1 to BLKz will be described in detail below with reference to FIGS. 4 and 5.

Figure 4:
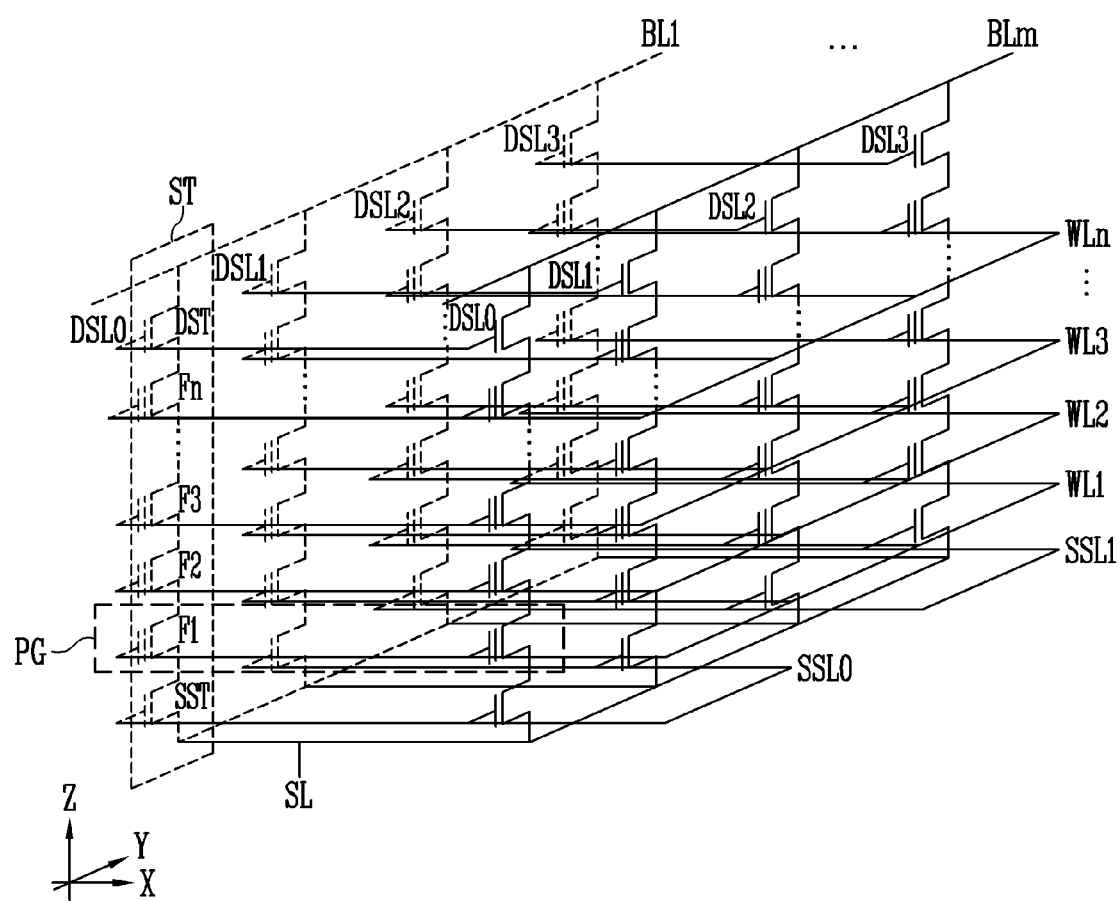
FIG. 4 is a circuit diagram illustrating in detail any one memory block illustrated in FIG. 3.

FIG. 4 is a circuit diagram illustrating in detail any one memory block illustrated in FIG. 3.

Figure 5:
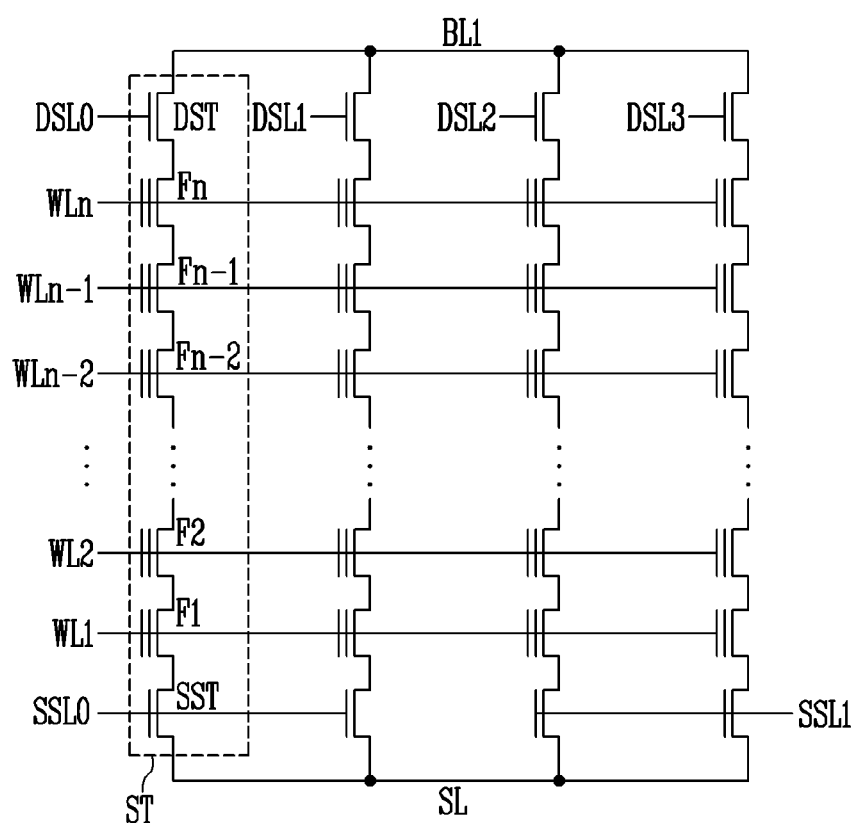
FIG. 5 is a circuit diagram illustrating memory strings illustrated in FIG. 4.

FIG. 5 is a circuit diagram illustrating memory strings illustrated in FIG. 4.

Referring to FIGS. 4 and 5, respective memory strings ST may be coupled between bit lines BL1 to BLm and a source line SL. A memory string ST coupled between the first bit line BL1 and the source line SL is described by way of example.

The memory string ST may include a source select transistor SST, memory cells F1 to Fn (where n is a positive integer), and a drain select transistor DST which are coupled in series between the source line SL and the first bit line BL1. Gates of source select transistors SST included in different memory strings ST coupled to different bit lines BL1 to BLm may be coupled to a first source select line SSL0 and to a second source select line SSL1. For example, among the source select transistors SST, source select transistors that are adjacent to each other in a second direction Y may be coupled to the same source select line. For example, assuming that the source select transistors SST are sequentially arranged along the second direction Y, the gates of the source select transistors SST which are arranged from the first source select transistor SST in a first direction X and which are included in different memory strings ST, and the gates of source select transistors SST which are arranged from the second source select transistor SST in the first direction X and which are included in different memory strings ST may be coupled to the first source select line SSL0. Also, the gates of the source select transistors SST which are arranged from the third source select transistor SST in the first direction X and which are included in different memory strings ST, and the gates of source select transistors SST which are arranged from the fourth source select transistor SST in the first direction X and which are included in different memory strings ST may be coupled to the second source select line SSL1.

The gates of the memory cells F1 to Fn may be coupled to the word lines WL1 to WLn, and the gates of the drain select transistors DST may be coupled to any one of the first to fourth drain select lines DSL0 to DSL3.

The gates of the transistors arranged in the first direction X, among the drain select transistors DST, may be coupled in common to the same drain select line (e.g., DSL0), but the gates of the transistors arranged in the second direction Y may be coupled to different drain select lines DSL1 to DSL3. For example, assuming that drain select transistors DST are sequentially arranged along the second direction Y, the gates of the drain select transistors DST which are arranged from the first drain select transistor DST in the first direction X and which are included in different memory strings ST may be coupled to the first drain select line DSL0. The drain select transistors DST, arranged from the drain select transistors DST coupled to the first drain select line DSL0 in the second direction Y, may be sequentially coupled to the second to fourth drain select lines DSL1 to DSL3. Therefore, in the selected memory block, memory strings ST coupled to the selected drain select line may be selected, and memory strings ST coupled to the remaining drain select lines, that is, unselected drain select lines, may be unselected.

The memory cells coupled to the same word line may form one page PG. Here, the term "page" means a physical page. For example, among the memory strings ST coupled to the first bit line BL1 to the m-th bit line BLm, a group of memory cells coupled in the first direction X in the same word line is referred to as a page PG. For example, among the first memory cells F1 coupled to the first word line WL1, memory cells arranged in the first direction X may form one page PG. Among the first memory cells F1 coupled in common to the first word line WL1, memory cells arranged in the second direction Y may be divided into different pages. Therefore, when the first drain select line DSL0 is a selected drain select line and the first word line WL1 is a selected word line, a page coupled to the first drain select line DSL0, among a plurality of pages PG coupled to the first word line WL1, may be the selected page. The pages which are coupled in common to the word line WL1, but are coupled to unselected second to fourth drain select lines DSL1 to DSL3 may be unselected pages.

Although, in the drawings, one source select transistor SST and one drain select transistor DST are illustrated as being included in one memory string ST, a plurality of source select transistors SST and a plurality of drain select transistors DST may be included in one memory string ST depending on the semiconductor memory. Also, dummy cells may be included between the source select transistor SST, the memory cells F1 to Fn, and the drain select transistor DST depending on the semiconductor memory. The dummy cells do not store user data like the normal memory cells F1 to Fn, but may be used to improve the electrical characteristics of each memory string ST. However, because the dummy cells are not essential components in the present embodiment, a detailed description thereof will be omitted here.

Figure 6:
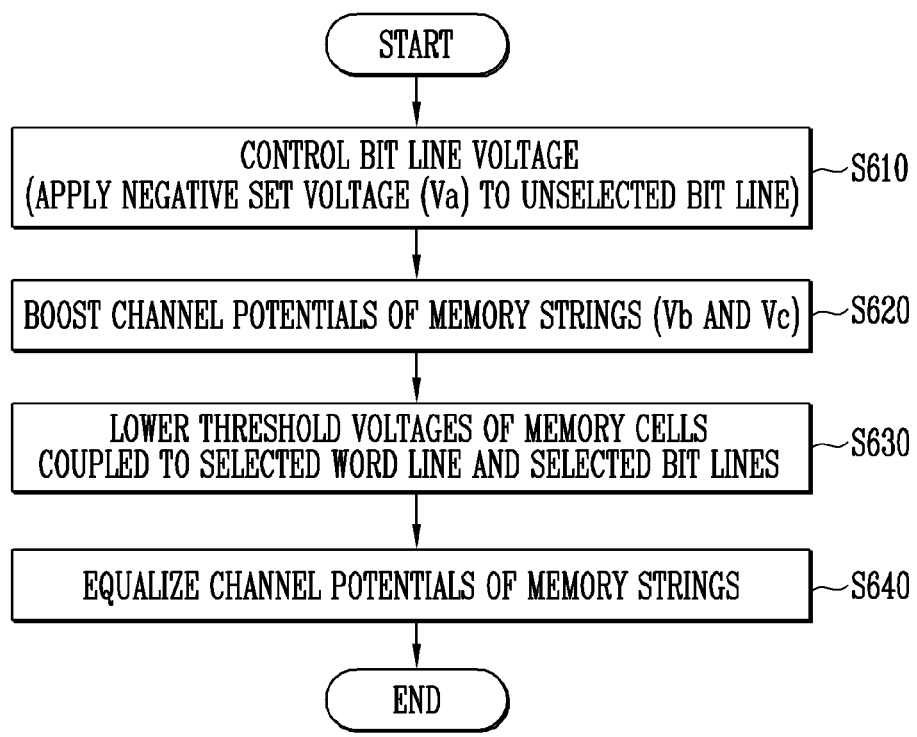
FIG. 6 is a flowchart illustrating the operation of a semiconductor memory device according to an embodiment of the present disclosure.

FIG. 6 is a flowchart illustrating an operation of a semiconductor memory device according to an embodiment of the present disclosure.

Figure 7:
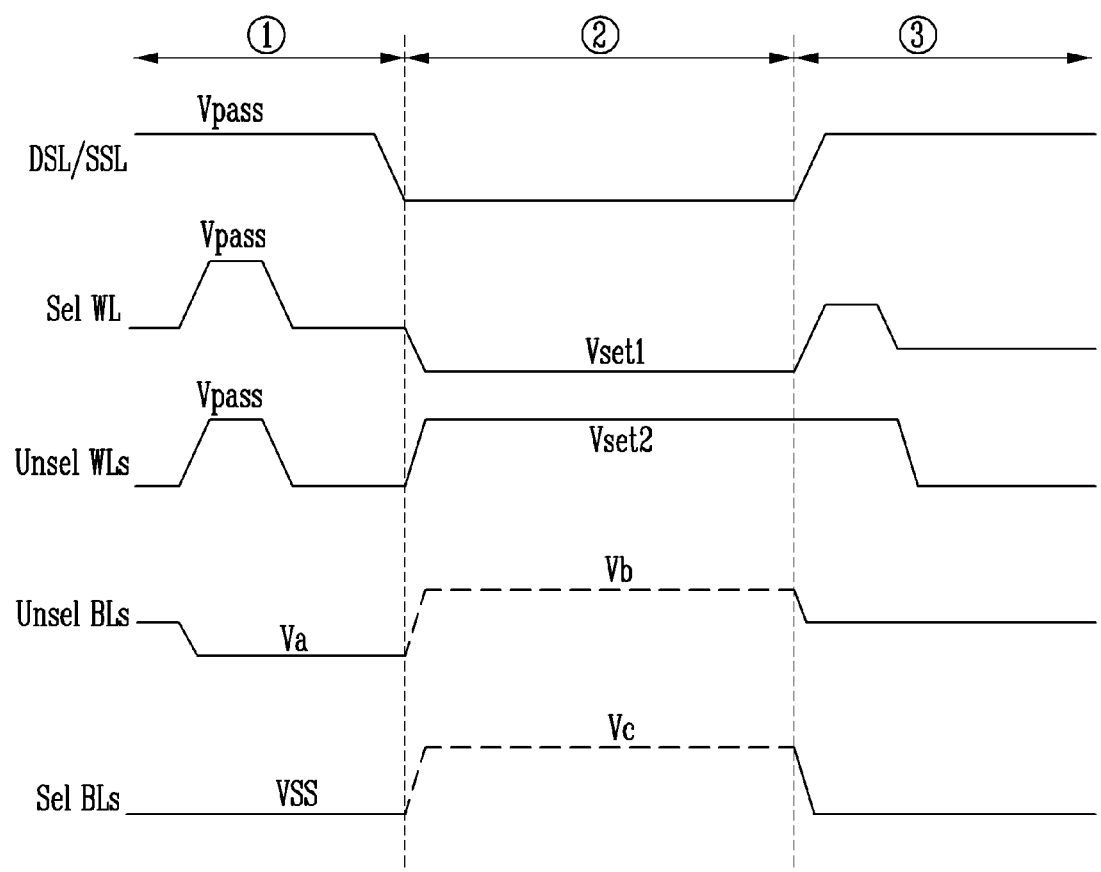
FIG. 7 is a waveform diagram of operating voltages for describing the operation of a semiconductor memory device according to the embodiment of the present disclosure.

FIG. 7 is a waveform diagram of operating voltages for describing the operation of a semiconductor memory device according to the embodiment of the present disclosure.

Figure 8:
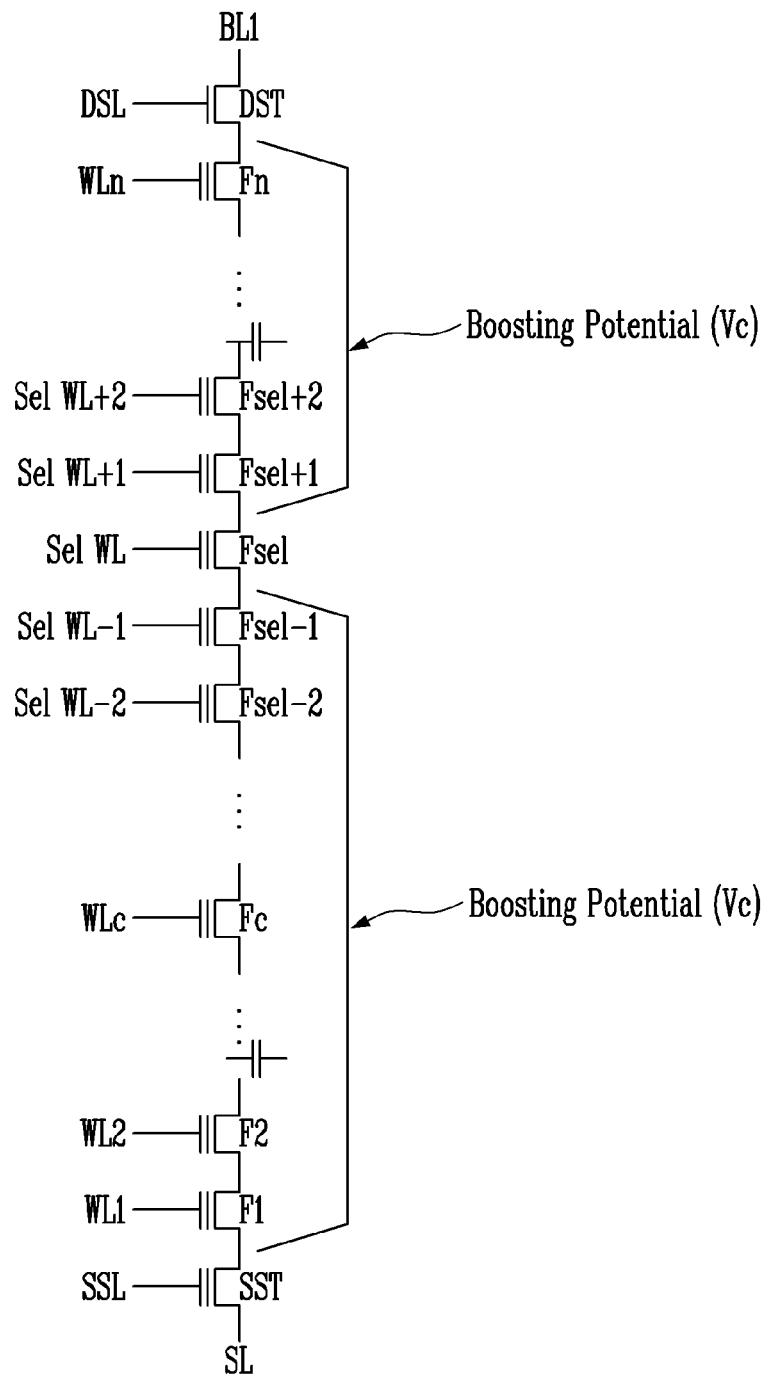
FIG. 8 is a diagram illustrating the states of the channel potentials of a selected memory string.

FIG. 8 is a diagram illustrating the states of the channel potentials of a selected memory string.

The operation of the semiconductor memory device according to an embodiment of the present disclosure will be described with reference to FIGS. 2 to 8.

The embodiment of the present disclosure describes a detrap operation of selectively lowering the threshold voltage of at least one memory cell selected from among a plurality of memory cells included in a selected page.

At step S610, the read and write circuit 130 controls the voltages of bit lines (e.g., BL1 to BLm) coupled to a selected memory block (e.g., BLK1).

For example, during a bit line charge period ①, the read and write circuit 130 may apply a first bit line voltage, that is, a ground voltage VSS, to selected bit lines coupled to selected memory cells, among the bit lines BL1 to BLm, and may apply a second bit line voltage, that is, a set voltage Va, to unselected bit lines coupled to unselected memory cells, among the bit lines BL1 to BLm. For example, the set voltage Va may be a negative voltage, for example, −3 V.

The voltage generation circuit 150 may generate and output a pass voltage Vpass, and the address decoder 120 may apply the pass voltage Vpass to the word lines WL1 to WLn, the drain select line (e.g., DSL0), and the source select line (e.g., SSL0) of the selected memory block BLK1. Due thereto, the channel of the selected memory string, which is coupled to the selected bit lines and corresponds to the drain select line DSL0, among the plurality of memory strings included in the selected memory block BLK1, is controlled to the level of the ground voltage VSS, and the channel of an unselected memory string, which is coupled to the unselected bit lines and corresponds to the drain select line DSL0, among the plurality of memory strings included in the selected memory block BLK1, is controlled to the level of the negative set voltage Va.

At step S620, the channel potentials of the memory strings ST may be boosted.

For example, during a boosting period ②, the address decoder 120 controls the channels of the selected memory string and the unselected memory string to float by applying a turn-off voltage (e.g., VSS) to the drain select line (e.g., DSL0) and the source select line (e.g., SSL0). The address decoder 120 may continue to apply the pass voltage Vpass to the remaining drain select lines (e.g., DSL1 to DSL3) and the remaining source select lines (e.g., SSL1).

Thereafter, the voltage generation circuit 150 may generate a first set voltage Vset1 and a second set voltage Vset2, and the address decoder 120 may apply the first set voltage Vset1 to a word line Sel WL corresponding to the selected page, and apply the second set voltage Vset2 to the remaining word lines, that is, unselected word lines Unsel WLs. For example, the first set voltage Vset1 may have a negative potential, and the second set voltage Vset2 may have a positive potential. For example, the first set voltage Vset1 may have a potential lower than that of the negative set voltage Va. For example, the first set voltage Vset1 may be a voltage lower than or equal to −3.5 V. For example, the second set voltage Vset2 may have a potential higher than that of the pass voltage Vpass. For example, the second set voltage Vset2 may be a voltage equal to or higher than 8.5 V.

Referring to FIG. 8, the channel potentials of the memory strings corresponding to the selected bit lines (e.g., BL1) rise to a boosting level Vc because a booting phenomenon occurs due to the second set voltage Vset2 applied to the unselected word lines WL1 to Sel WL−1 and Sel WL+1 to WLn. The boosting level Vc may be equal to the second set voltage Vset2 or lower than the second set voltage Vset2 by a certain voltage (e.g., 0.5 V).

On the other hand, the channel potentials of the memory strings corresponding to the unselected bit lines Unsel BLs may be boosted to a level lower than that of the channel potentials of the memory strings corresponding to the selected bit lines Sel BLs. The channels of the memory strings corresponding to the unselected bit lines Unsel BLs may be controlled to the negative set voltage Va during the bit line charge period ①, and the potentials of the channels may rise to the booting level Vb due to a boosting phenomenon caused by the second set voltage Vset2 applied to the unselected word lines WL1 to Sel WL−1 and Sel WL+1 to WLn. Accordingly, the channels of the unselected memory strings may be boosted to a level that is equal to the sum of the second set voltage Vset2 and the set voltage Va, or lower than the sum by a certain voltage (e.g., 0.5 V).

At step S630, the threshold voltages of memory cells coupled to the selected bit lines and the selected word line may be lowered.

The channel potential of the memory string corresponding to each selected bit line (e.g., BL1) may be boosted to the boosting level Vc that is relatively high at the previous step S620. Accordingly, some of electrons trapped in the charge trap layer of a selected memory cell Fsel included in the selected memory string may be detrapped into an adjacent channel region due to the difference between the first set voltage Vset1 applied to the selected word line Sel WL and the boosting level Vc of the adjacent channel region. Accordingly, the threshold voltage of the selected memory cell Fsel may be lowered.

On the other hand, the channel potentials of the memory strings corresponding to the unselected bit lines Unsel BLs may be boosted to the boosting level Vb that is relatively low at the previous step S620. The threshold voltages of memory cells coupled to the selected word line Sel WL, among memory cells included in each unselected memory string, are not lowered due to the relatively low channel boosting level Vb.

At step S640, the channel potentials of the memory strings may be equalized.

For example, during an equalizing period ③, the read and write circuit 130 may apply a ground voltage to the bit lines BL1 to BLm, and the address decoder 120 may apply the pass voltage Vpass to the word lines WL1 to WLn, the drain select line (e.g., DSL0), and the source select line (e.g., SSL0) of the selected memory block BLK1. Due thereto, the channels of the plurality of memory strings included in the selected memory block BLK1 are discharged to the ground voltage level by the source line SL and the bit lines BL1 to BLm to which the ground voltage is applied, and are then equalized.

In accordance with the above-described embodiment of the present disclosure, the threshold voltages of the selected memory cells included in the selected page may be lowered by selectively performing a detrap operation on the selected memory cells.

FIG. 9 is a flowchart illustrating the operation of a semiconductor memory device according to an embodiment of the present disclosure.

Figure 10B:
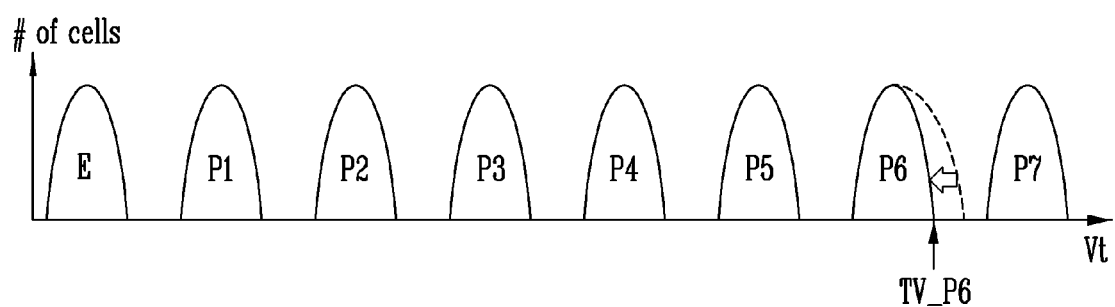
Figure 10C:
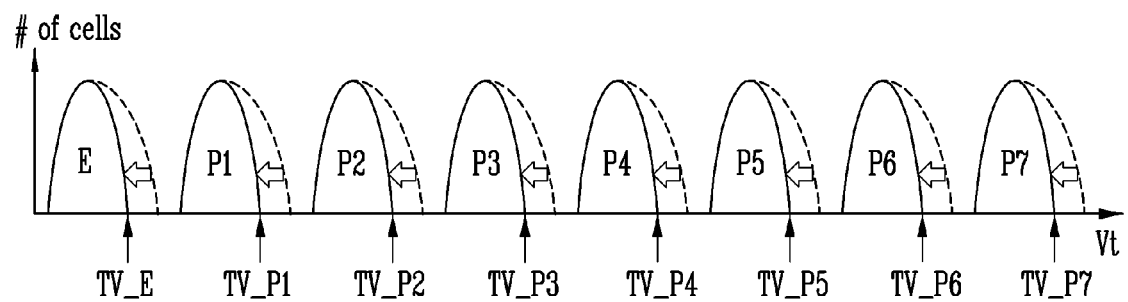

FIGS. 10A to 10C are diagrams illustrating threshold voltage distributions of memory cells for describing various embodiments in which a target program state is set.

The operation of the semiconductor memory device (also referred to as semiconductor memory) according to an embodiment of the present disclosure will be described with reference to FIGS. 1 to 5, 9, and to 10C.

At step S910, a program operation may be performed on a selected page.

The semiconductor memory 100 receives a command CMD, corresponding to a program operation, and data to be programmed DATA from an external device (e.g., the controller 1200 of FIG. 1). The semiconductor memory 100 may receive an address ADDR, together with the command CMD and the data to be programmed DATA.

The semiconductor memory 100 may perform the program operation on the selected page of a selected memory block (e.g., BLK1) in response to the command CMD corresponding to the program operation.

For example, the plurality of page buffers PB1 to PBm included in the read and write circuit 130 may receive the data to be programmed DATA in response to control signals PB_signals output from the control logic 140, may temporarily store the received data DATA, and may control the potentials of the bit lines BL1 to BLm respectively corresponding to the page buffers depending on the temporarily stored data. The voltage generation circuit 150 may generate a program voltage Vpgm and a pass voltage Vpass in response to voltage generation circuit control signals VG_signals output from the control logic 140.

The address decoder 120 may apply the program voltage Vpgm to the word line (e.g., WL1) corresponding to the selected page of the selected memory block BLK1 and apply the pass voltage Vpass to unselected word lines (e.g., WL2 to WLn) in response to address decoder control signals AD_signals, generated by the control logic 140, and the address ADDR.

Thereafter, a verify operation is performed so as to verify whether the memory cells included in the selected page are programmed to respective target program states, for example, an erased state E and a plurality of program states P1 to P7.

At step S920, memory cells, the threshold voltages of which are to be lowered, are selected from among the memory cells included in the selected page on which the above-described step S910 is completed. In the embodiment of the present disclosure, the memory cells, the threshold voltages of which are to be lowered, may be memory cells having threshold voltages equal to or higher than a preset threshold voltage TV_E, among memory cells corresponding to the erased state E having the lowest threshold voltage distribution, or memory cells having threshold voltages equal to or higher than a preset threshold voltage TV_6, among memory cells programmed to the program state P6 adjacent to the program state P7 having the highest threshold voltage distribution, or memory cells having threshold voltages equal to or higher than respective preset threshold voltages TV_E, TV_P1, TV_P2, TV_P3, TV_P4, TV_P5, TV_P6, and TV_P7, among the memory cells respectively corresponding to the erased state E and the plurality of program states P1 to P7. A detailed description thereof will be made later with reference to FIGS. 10A to 10C.

At step S930, a first bit line voltage (e.g., VSS) may be applied to bit lines corresponding to the selected memory cells, and a second bit line voltage Va may be applied to bit lines corresponding to unselected memory cells. The second bit line voltage Va may be a negative voltage. For example, the second bit line voltage Va may be −3 V. That is, a detrap operation may be performed on the selected memory cells.

The operation of applying the first bit line voltage (e.g., VSS) or the second bit line voltage Va to the bit lines BL1 to BLm of the selected memory block is similar to step S610 of FIG. 6, and thus a detailed description thereof will not be repeated here.

At step S940, the channels of memory strings may float, a first set voltage Vset1 may be applied to the selected word line, and a second set voltage Vset2 may be applied to the unselected word lines, and thus the channel of a memory string in which the selected memory cells are included may be boosted.

The operation of applying the first set voltage Vset1 and the second set voltage Vset2 to the word lines WL1 to WLn is similar to step S620 of FIG. 6, and thus a detailed description thereof will not be repeated here.

The channel potential of the memory string corresponding to the selected bit line (e.g., BL1) is boosted to a relatively high boosting level through the second set voltage Vset2 applied to the unselected word lines. Accordingly, some of charges trapped in the charge trap layers of the selected memory cells may be detrapped into adjacent channels due to the difference between the first set voltage Vset1 applied to the selected word line and the boosting level of adjacent channel regions. Accordingly, the threshold voltages of the selected memory cells may be lowered.

Referring to FIG. 10A, when selected memory cells are memory cells having threshold voltages equal to or higher than a preset threshold voltage TV_E, among the memory cells corresponding to the erased state E, the threshold voltages of the selected memory cells are lowered, whereby the width of the threshold voltage distribution of the memory cells corresponding to the erased state E becomes narrow. As a result, the interval between the threshold voltage distributions of the erased state E and the program state P1 is increased, and thus a sensing margin in a read operation may be improved.

Referring to FIG. 10B, when selected memory cells are memory cells having threshold voltages equal to or higher than a preset threshold voltage TV_P6, among the memory cells corresponding to the program state P6 adjacent to the highest program state P7, the threshold voltages of the selected memory cells are lowered, whereby the width of the threshold voltage distribution of the memory cells corresponding to the program state P6 becomes narrow. As a result, the interval between the threshold voltage distributions of the program state P6 and the program state P7 is increased, and thus a sensing margin in a read operation may be improved.

Referring to FIG. 10C, when the selected memory cells are memory cells having threshold voltages equal to or higher than respective preset threshold voltages TV_E, TV_P1, TV_P2, TV_P3, TV_P4, TV_P5, TV_P6, and TV_P7, among the memory cells respectively corresponding to the erased state E and the plurality of program states P1 to P7, the threshold voltages of the selected memory cells are lowered, whereby the widths of the threshold voltage distributions of the memory cells respectively corresponding to the erased state E and the plurality of program states P1 to P7 become narrow. Therefore, the intervals between the adjacent threshold voltage distributions are increased, and thus a sensing margin in a read operation may be improved.

At step S950, the channel potentials of memory strings included in the selected memory block may be equalized.

The operation of equalizing the channel potentials of the memory strings is similar to step S640 of FIG. 6, and thus a detailed description thereof will not be repeated here.

As described above, the semiconductor memory according to the embodiment of the present disclosure performs a detrap operation, described above with reference to FIGS. 6 to 8, on memory cells selected from among the memory cells on which the program operation has been performed. Therefore, the threshold voltages of the selected memory cells may be selectively lowered, and the threshold voltage distributions corresponding to the erased state E and the plurality of program states P1 to P7 may be improved.

Figure 11:
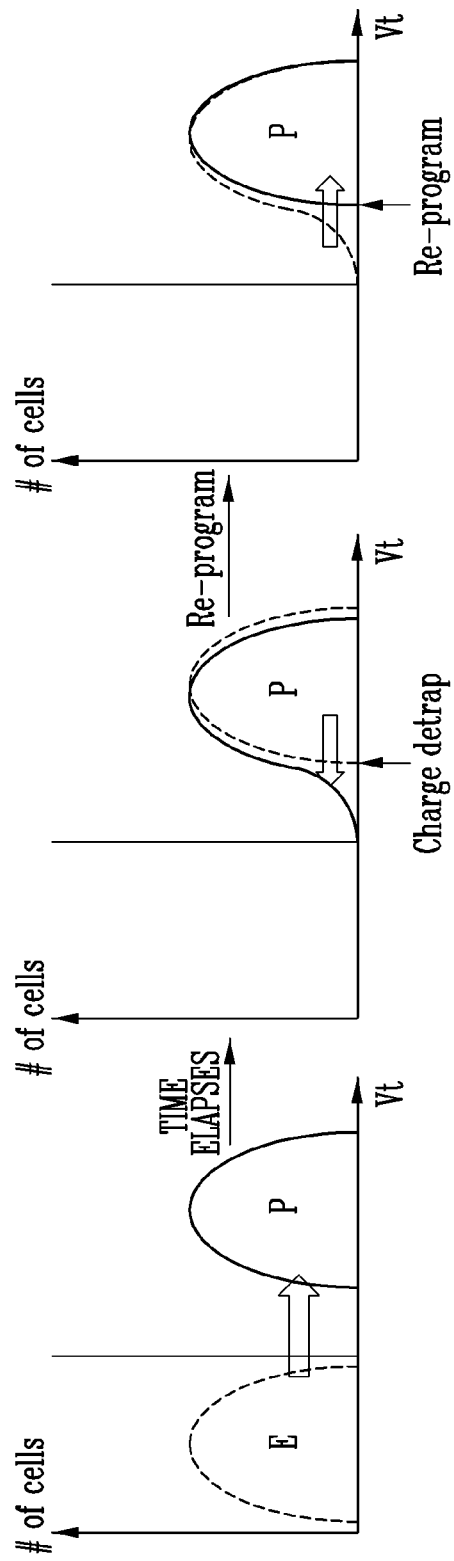
FIG. 11 is a diagram illustrating both a phenomenon, in which electrons are detrapped from charge trap layers of programmed memory cells, and a second program operation.

FIG. 11 is a diagram illustrating both a phenomenon, in which electrons are detrapped from charge trap layers of programmed memory cells, and a second program operation.

During a program operation, when a program voltage is applied to selected memory cells, electrons may be trapped in the charge trap layers of the selected memory cells. When electrons are trapped in the charge trap layers, the threshold voltages of the selected memory cells may increase. When the electrons trapped in the charge trap layers are detrapped, the threshold voltages of the selected memory cells may decrease.

Referring to FIG. 11, the graph in the left portion of the drawing indicates the threshold voltage distribution of selected memory cells immediately after a first program operation has been completed on the selected memory cells. The graph in the middle portion of the drawing indicates the threshold voltage distribution of the selected memory cells after a certain time has elapsed since the completion of the first program operation performed on the selected memory cells. The graph in the right portion of the drawing indicates the threshold voltage distribution of the selected memory cells after a second program operation, for example, a re-program operation, performed on the selected memory cells has been completed.

Referring to the left graph in FIG. 11, when the first program operation is performed on the selected memory cells in an erased state E, the threshold voltages of the selected memory cells may be shifted to a program state P.

Referring to the middle graph of FIG. 11, as time elapses after the completion of the first program operation, electrons trapped in the charge trap layers of the selected memory cells may be detrapped. When electrons are detrapped from the charge trap layers, the threshold voltages of the selected memory cells may decrease.

Referring to the right graph of FIG. 11, after a certain time has elapsed since the completion of the first program operation, a second program operation may be performed on the selected memory cells. The threshold voltage distribution of the selected memory cells after the second program operation has been performed may be narrower than a threshold voltage distribution in the state in which a certain time has elapsed since the performance of the first program operation.

Figure 12:
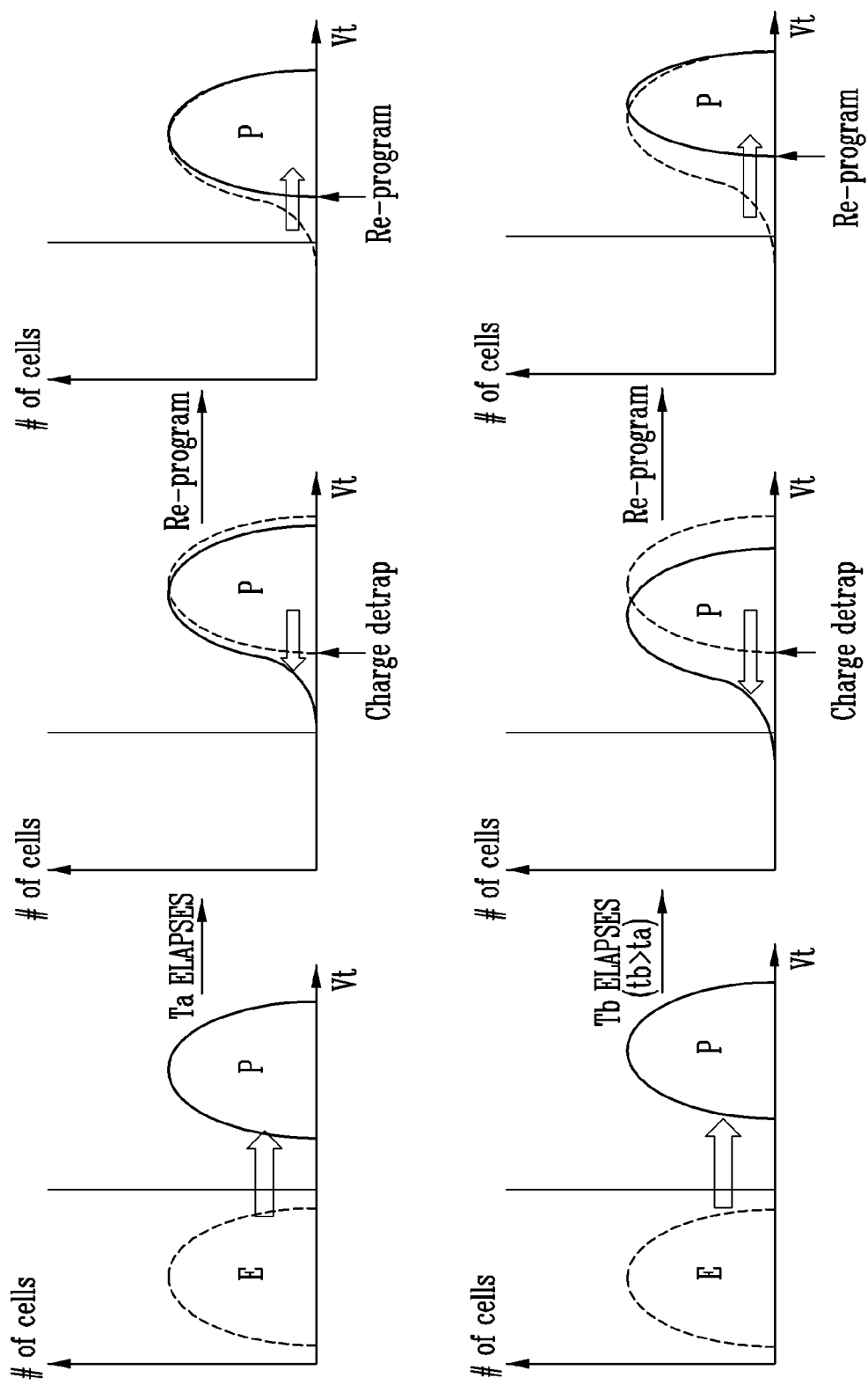
FIG. 12 is a diagram for describing the difference between threshold voltage distributions of memory cells depending on the time elapsed from the completion of a first program operation to a time point before a second program operation starts.

FIG. 12 is a diagram for describing the difference between threshold voltage distributions of memory cells depending on the time elapsed from the completion of a first program operation to a time point before a second program operation starts.

Graphs in the upper portion of FIG. 12 show the threshold voltage distribution of selected memory cells in the case where, after a first time ta has elapsed since the performance of the first program operation on the selected memory cells, the second program operation is performed on the selected memory cells.

Graphs in the lower portion of FIG. 12 show the threshold voltage distribution of selected memory cells in the case where, after a second time tb longer than the first time ta has elapsed since the performance of the first program operation on the selected memory cells, the second program operation is performed on the selected memory cells.

Referring to FIG. 12, the extent to which the threshold voltage distribution of the selected memory cells is shifted in the case where the second time tb has elapsed since the completion of the first program operation on the selected memory cells may be greater than that in the case where the first time ta has elapsed since the completion of the first program operation on the selected memory cells. The second time tb may be longer than the first time ta. That is, the number of electrons detrapped from the charge trap layers of the selected memory cells, among the electrons trapped in the charge trap layers, are detrapped, may increase with the lapse of time. Therefore, the extent to which the threshold voltage distribution of the selected memory cells is shifted to the left may increase as time has elapsed since the completion of the first program operation.

Referring to the two right graphs in FIG. 12, the threshold voltage distribution of selected memory cells in the lower graph may be narrower than that of the selected memory cells in the upper graph. That is, as the time from a time point at which the first program operation performed on the selected memory cells has been completed to a time point at which the second program operation starts is longer, the threshold voltage distribution of the selected memory cells after the second program operation has been completed may be narrower.

However, when the time from the time point at which the first program operation performed on the selected memory cells has been completed to the time point at which the second program operation starts is increased to improve threshold voltage distributions, the total time required for the entire program operation on the selected memory cells may be increased.

Figure 13:
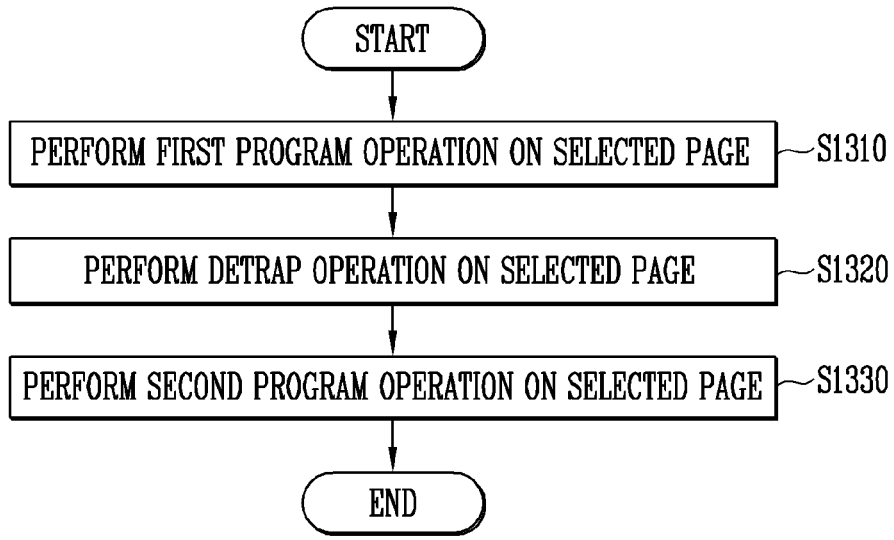
FIG. 13 is a flowchart illustrating the operation of a semiconductor memory device according to an embodiment of the present disclosure.

FIG. 13 is a flowchart illustrating the operation of a semiconductor memory device according to an embodiment of the present disclosure.

Figure 14:
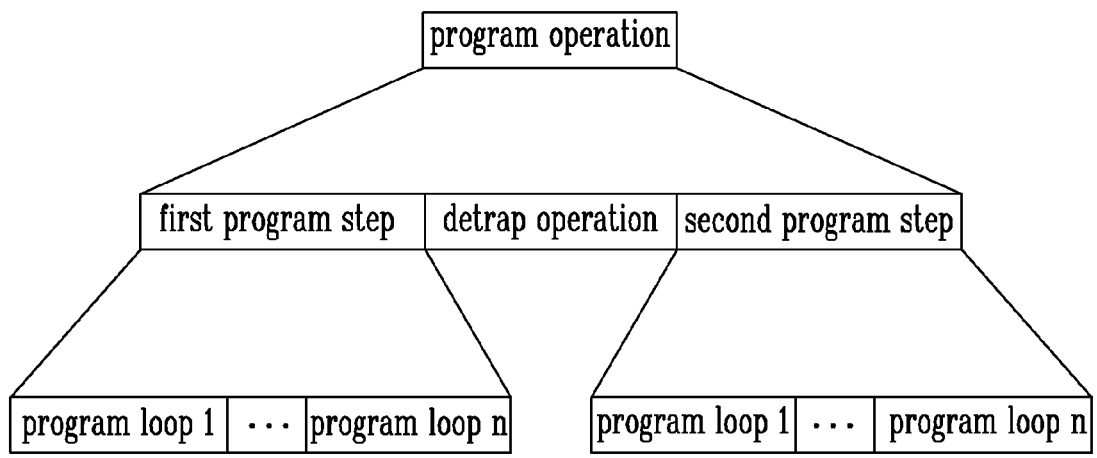
FIG. 14 is a diagram illustrating the configuration of detailed operations included in a program operation according to an embodiment of the present disclosure.

FIG. 14 is a diagram illustrating the configuration of detailed operations included in a program operation according to an embodiment of the present disclosure.

Figure 15:
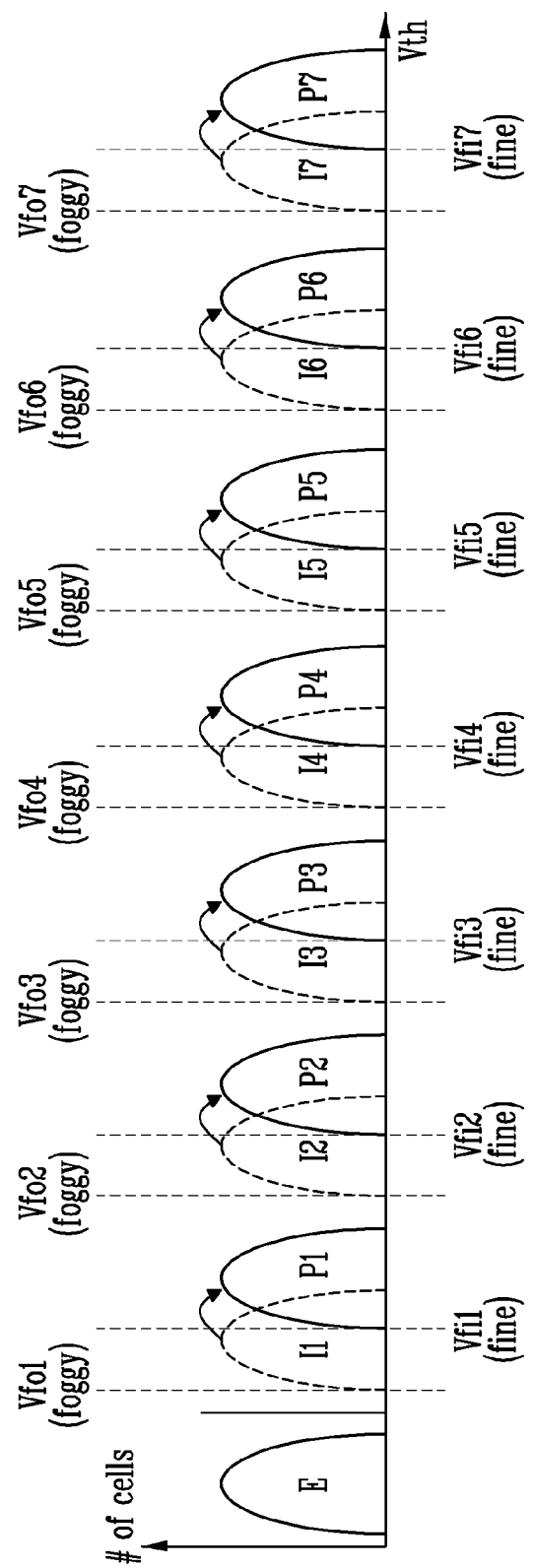
FIG. 15 is a diagram illustrating threshold voltage distributions of memory cells for describing the operation of a semiconductor memory device according to an embodiment of the present disclosure.

FIG. 15 is a diagram illustrating threshold voltage distributions of memory cells for describing the operation of a semiconductor memory device according to an embodiment of the present disclosure.

The operation of the semiconductor memory device according to an embodiment of the present disclosure will be described with reference to FIGS. 1 to 5 and 13 to 15.

The semiconductor memory 100 receives a command CMD, corresponding to a program operation, and data to be programmed DATA from an external device (e.g., the controller 1200 of FIG. 1). The semiconductor memory 100 may receive an address ADDR, together with the command CMD and the data to be programmed DATA.

The semiconductor memory 100 may perform a program operation on a selected page of a selected memory block (e.g., BLK1) in response to the command CMD corresponding to the program operation.

The program operation performed on the selected page is described as follows.

At step S1310, a first program operation is performed on the selected page. For example, the first program operation is an operation of programming memory cells included in the selected page so that the memory cells have a threshold voltage distribution lower than a target threshold voltage distribution.

Referring to FIG. 14, the first program operation may include a plurality of program loops. Each of the plurality of program loops may include a program voltage apply step and a verify operation step. The program voltage apply step may be the step of applying a program voltage to a word line coupled to selected memory cells. The program voltage may be increased by a step voltage whenever the number of program loops increases. The verify operation step may be the step of verifying whether each selected memory cell has been programmed to a target program state.

For example, at the program voltage apply step, the plurality of page buffers PB1 to PBm included in the read and write circuit 130 may receive the data to be programmed DATA in response to control signals PB_signals output from the control logic 140, may temporarily store the received data DATA, and may control the potentials of the bit lines BL1 to BLm respectively corresponding to the page buffers depending on the temporarily stored data. The voltage generation circuit 150 may generate a program voltage Vpgm and a pass voltage Vpass in response to voltage generation circuit control signals VG_signals output from the control logic 140. The address decoder 120 may apply the program voltage Vpgm to the word line (e.g., WL1) corresponding to the selected page of the selected memory block BLK1 and apply the pass voltage Vpass to unselected word lines (e.g., WL2 to WLn) in response to address decoder control signals AD_signals, generated by the control logic 140, and the address ADDR.

Thereafter, at the verify operation step, the voltage generation circuit 150 may generate a plurality of verify voltages, corresponding to respective program states P1 to P7, and the pass voltage Vpass in response to voltage generation circuit control signals VG_signals output from the control logic 140. The address decoder 120 may sequentially apply the plurality of verify voltages to the word line (e.g., WL1) corresponding to the selected page and apply the pass voltage Vpass to unselected word lines (e.g., WL2 to WLn) in response to address decoder control signals AD_signals, generated by the control logic 140, and the address ADDR. The plurality of page buffers PB1 to PBm of the read and write circuit 130 may sense verify data based on the potentials or current amounts of the corresponding bit lines BL1 to BLm, and may determine whether the memory cells have passed or failed the program operation based on the sensed verify data.

The first program operation may be defined as a foggy program operation, wherein, during the foggy program operation, the peripheral circuit 160 programs the memory cells included in the selected page to pre-program states I1 to I7 in which the memory cells have threshold voltages equal to or higher than foggy verify voltages Vfo1 to Vfo7.

At step S1320, the semiconductor memory 100 performs a detrap operation on the selected page. A method of performing the detrap operation has been described above with reference to steps S610 to S640 of FIG. 6, and thus a detailed description thereof will not be repeated here. The semiconductor memory 100 may selectively perform a detrap operation on the memory cells programmed to the plurality of pre-program states I1 to I7, among the memory cells included in the selected page.

The threshold voltages of the memory cells programmed to the plurality of pre-program states I1 to I7 may be lowered through the detrap operation.

At step S1330, the semiconductor memory 100 may perform a second program operation on the selected page.

Referring to FIG. 14, the second program operation may include a plurality of program loops. Each of the plurality of program loops may include a program voltage apply step and a verify operation step. The program voltage apply step may be the step of applying a program voltage to a word line coupled to selected memory cells. The program voltage may be increased by a step voltage whenever the number of program loops increases. The verify operation step may be the step of verifying whether each selected memory cell has been programmed to a target program state.

The second program operation may be defined as a fine program operation, wherein, during the fine program operation, the peripheral circuit 160 programs the memory cells included in the selected page to target program states P1 to P7 in which the memory cells have threshold voltages equal to or higher than fine verify voltages Vfi1 to Vfi7.

The first program operation and the second program operation may be performed in various forms without being limited to the above-described foggy program operation and fine program operation.

In an example, the first program operation may be intended to pre-program the selected memory cells to pre-program states, and the second program operation may be intended to program the selected memory cells to target program states in a main program manner. In other examples, the first program operation may be intended to program the selected memory cells to target program states, and the second program operation may be intended to re-program the selected memory cells so that threshold voltage distributions corresponding to respective program states are corrected to be narrow. In each embodiment, a detrap operation may be performed on the selected memory cells before the second program operation is performed after the first program operation has been completed.

Figure 16:
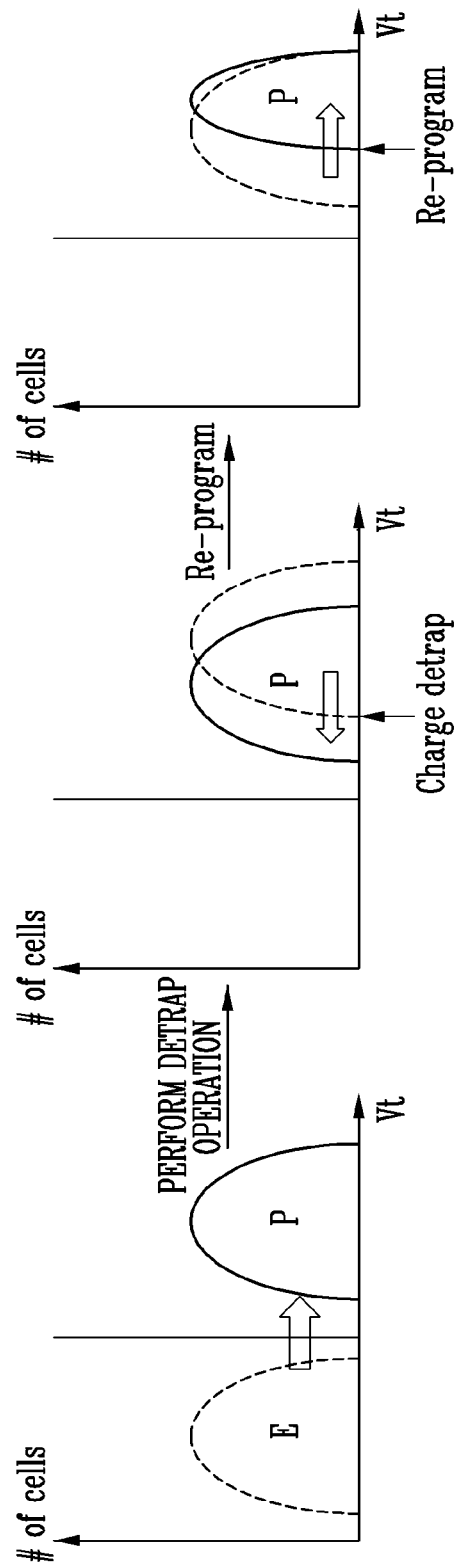
FIG. 16 is a diagram for describing threshold voltages of memory cells on which a first program operation, a detrap operation, and a second program operation are sequentially performed.

FIG. 16 is a diagram for describing threshold voltages of memory cells on which a first program operation, a detrap operation, and a second program operation are sequentially performed.

Referring to FIG. 16, after the first program operation has been performed on selected memory cells, the detrap operation may be performed on the selected memory cells. The detrap operation may be an operation of lowering the threshold voltages of selected memory cells by detrapping electrons trapped in charge trap layers of the selected memory cells after the first program operation has been completed.

Referring to the graph in the middle portion of FIG. 16, when the detrap operation is performed on the selected memory cells, some of electrons trapped in the charge trap layers of the selected memory cells may be detrapped. When electrons trapped in the charge trap layers are detrapped, the threshold voltage distribution of the selected memory cells may be shifted to the left. That is, the threshold voltage distribution of the selected memory cells may be lowered.

When the detrap operation performed on the selected memory cells is completed, the second program operation may be performed on the selected memory cells. The number of electrons detrapped while the detrap operation is being performed may be greater than the number of electrons that are naturally detrapped for the same time. Therefore, the threshold voltage distribution of the selected memory cells on which the second program operation has been completed may be improved while a delay in the total time required for the entire program operation on the selected memory cells is minimized.

Figure 17:
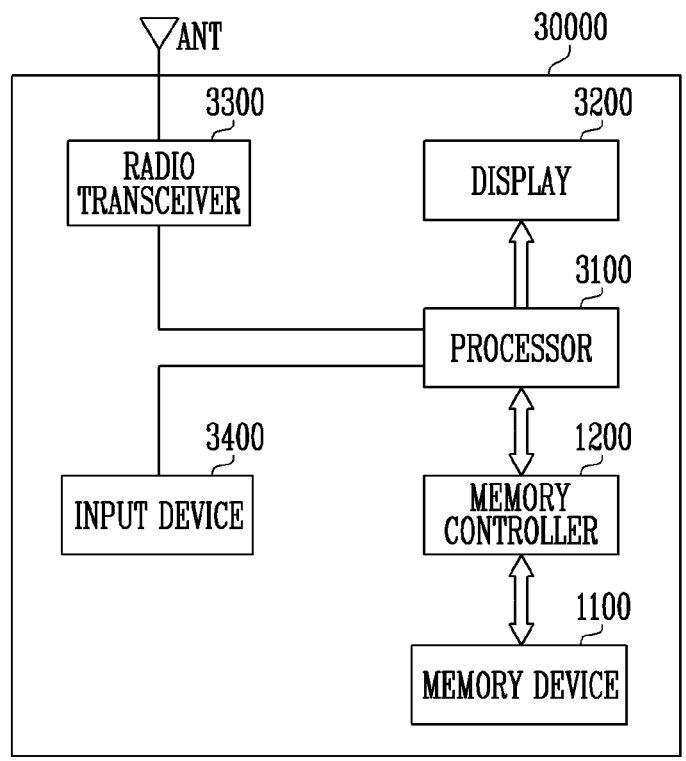
FIG. 17 is a diagram illustrating an embodiment of a memory system.

FIG. 17 is a diagram illustrating an embodiment of a memory system.

Referring to FIG. 17, a memory system 30000 may be implemented as a cellular phone, a smart phone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100. Further, the memory controller 1200 may be implemented through the example of the controller 1200 illustrated in FIG. 1.

Figure 18:
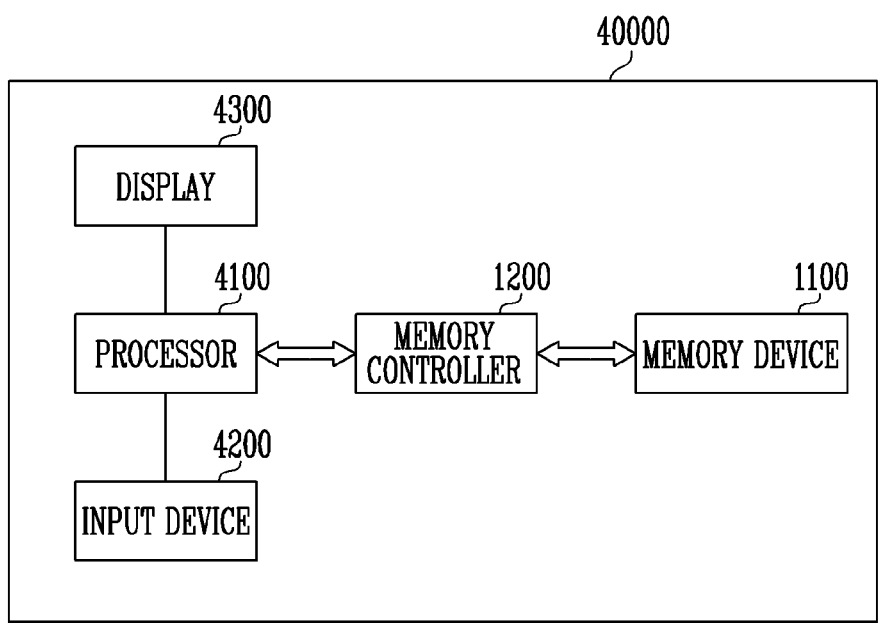
FIG. 18 is a diagram illustrating an embodiment of a memory system.

FIG. 18 is a diagram illustrating an embodiment of a memory system.

Referring to FIG. 18, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad or a computer mouse, a keypad or a keyboard.

The processor 4100 may control the overall operation of the memory system 40000, and may control the operation of the memory controller 1200. In an embodiment, the memory controller 1200 capable of controlling the operation of the memory device 1100 may be implemented as a part of the processor 4100 or as a chip provided separately from the processor 4100. Furthermore, the memory controller 1200 may be implemented through the example of the controller 1200 illustrated in FIG. 1.

Figure 19:
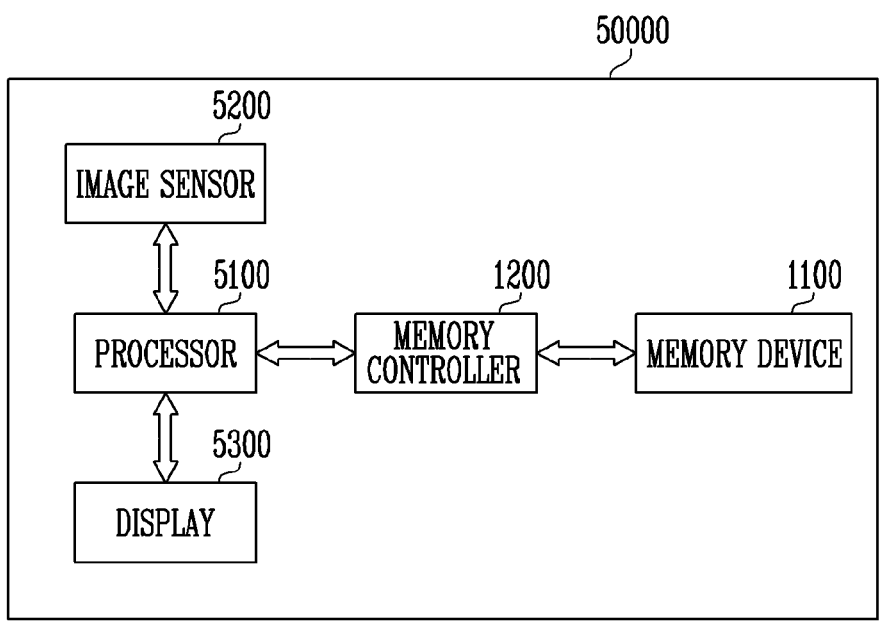
FIG. 19 is a diagram illustrating an embodiment of a memory system.

FIG. 19 is a diagram illustrating an embodiment of a memory system.

Referring to FIG. 19, a memory system 50000 may be implemented in an image processing device, for example, a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation of the memory device 1100, for example, a program operation, an erase operation or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100. Furthermore, the memory controller 1200 may be implemented through the example of the controller 1200 illustrated in FIG. 1.

Figure 20:
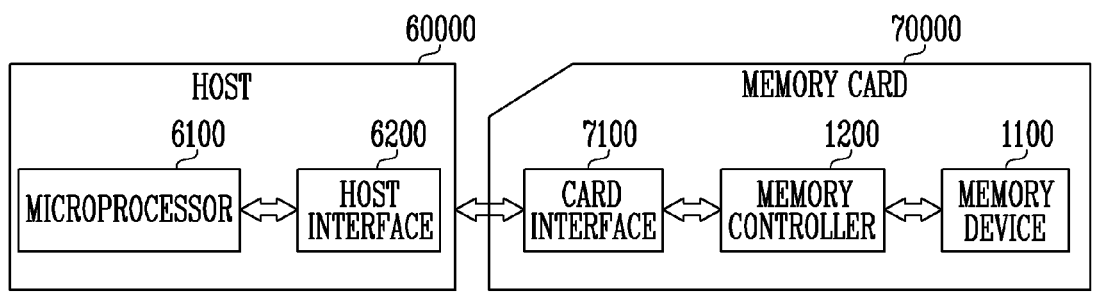
FIG. 20 is a diagram illustrating an embodiment of a memory system.

FIG. 20 is a diagram illustrating an embodiment of a memory system.

Referring to FIG. 20, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Furthermore, the memory controller 1200 may be implemented through the example of the controller 1200 illustrated in FIG. 1.

The card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

The present disclosure may improve threshold voltage distributions by selectively performing a detrap operation on memory cells and then lowering threshold voltages of the memory cells.

What is claimed is:

1. A semiconductor memory device, comprising:
   a memory block including a plurality of pages;
   a read and write circuit configured to apply a first bit line voltage to a selected bit line corresponding to at least one selected memory cell, among a plurality of bit lines of the memory block, during a detrap operation on the at least one selected memory cell included in a page selected from among the plurality of pages, and apply a second bit line voltage having a potential lower than a potential of the first bit line voltage to an unselected bit line, among the plurality of bit lines, during the detrap operation;
   a voltage generation circuit configured to generate a first set voltage and a second set voltage during the detrap operation; and
   an address decoder configured to apply the first set voltage to a selected word line corresponding to the selected page and apply the second set voltage having a potential higher than a potential of the first set voltage to unselected word lines, during the detrap operation,
   wherein the first bit line voltage has a ground voltage level and the second bit line voltage has a negative potential.

2. The semiconductor memory device according to claim 1, wherein, during a bit line charge period included in the detrap operation, the read and write circuit is configured to control respective channel potentials of a plurality of memory strings corresponding to the selected bit line and the unselected bit line by applying the first bit line voltage having the ground voltage level to the selected bit line and applying the second bit line voltage having the negative potential to the unselected bit line.

3. The semiconductor memory device according to claim 2, wherein the address decoder is configured to allow channels of the plurality of memory strings to float by turning off source select transistors and drain select transistors that are included in the memory block during a boosting period after the bit line charge period ends.

4. The semiconductor memory device according to claim 3, wherein the address decoder is configured to boost the channels of the plurality of memory strings by applying the second set voltage to the unselected word lines during the boosting period.

5. The semiconductor memory device according to claim 4, wherein a channel boosting level of a selected memory string corresponding to the selected bit line, among the plurality of memory strings, is higher than a channel boosting level of an unselected memory string corresponding to the unselected bit line.

6. The semiconductor memory device according to claim 5, wherein a memory cell coupled to the selected word line, among a plurality of memory cells included in the selected memory string, has a threshold voltage that is lowered due to a difference between the first set voltage applied to the selected word line and the channel boosting level of the selected memory string.

7. The semiconductor memory device according to claim 1, wherein the first set voltage has a negative potential.

8. A method of operating a semiconductor memory device, the method comprising:
applying a first bit line voltage to at least one selected bit line corresponding to at least one memory cell selected from among a plurality of memory cells included in a selected page, and applying a second bit line voltage lower than the first bit line voltage to an unselected bit line;
allowing channels of a plurality of memory strings respectively corresponding to the plurality of memory cells to float; and
boosting the channels of the plurality of memory strings by applying a first set voltage to a selected word line corresponding to the selected page and by applying a second set voltage having a potential higher than a potential of the first set voltage to unselected word lines corresponding to unselected pages,
wherein the first bit line voltage is a ground voltage, and the second bit line voltage is a negative voltage.

9. The method according to claim 8, wherein the first set voltage is a negative voltage.

10. The method according to claim 8, wherein boosting the channels of the plurality of memory strings comprises:
boosting a selected memory string corresponding to the at least one selected bit line, among the plurality of memory strings, to a first channel potential; and
boosting an unselected memory string corresponding to the unselected bit line, among the plurality of memory strings, to a second channel potential lower than the first channel potential.

11. The method according to claim 10, wherein the at least one selected memory cell has a threshold voltage that is lowered as trapped electrons are detrapped due to a difference between the first channel potential and the potential of the first set voltage applied to the selected word line.

12. A method of operating a semiconductor memory device, the method comprising:
performing a program operation on a page selected from among a plurality of pages; and
performing a detrap operation on the selected page, wherein the detrap operation comprises:
applying a first bit line voltage to at least one selected bit line corresponding to at least one memory cell selected from among a plurality of memory cells included in the selected page, and applying a second bit line voltage lower than the first bit line voltage to an unselected bit line;
allowing channels of a plurality of memory strings respectively corresponding to the plurality of memory cells to float; and
boosting the channels of the plurality of memory strings by applying a first set voltage to a selected word line corresponding to the selected page and by applying a second set voltage having a potential higher than a potential of the first set voltage to unselected word lines corresponding to unselected pages,
wherein the first bit line voltage is a ground voltage, and the second bit line voltage is a negative voltage.

13. The method according to claim 12, wherein the at least one selected memory cell is a memory cell that corresponds to a specific state and has a threshold voltage higher than a preset threshold voltage, among the plurality of memory cells.

14. The method according to claim 13, wherein the specific state is an erased state, among the erased state and a plurality of program states.

15. The method according to claim 13, wherein the specific state is a program state adjacent to a program state having a highest threshold voltage distribution, among an erased state and a plurality of program states.

16. The method according to claim 12, wherein the at least one selected memory cell is a memory cell having a threshold voltage higher than each of a plurality of preset threshold voltages respectively corresponding to an erased state and a plurality of program states, among the plurality of memory cells programmed to the erased state and the plurality of program states.

17. The method according to claim 12, wherein the first set voltage is a negative voltage.

18. The method according to claim 12, wherein boosting the channels of the plurality of memory strings comprises:
boosting a selected memory string corresponding to the at least one selected bit line, among the plurality of memory strings, to a first channel potential; and
boosting an unselected memory string corresponding to the unselected bit line, among the plurality of memory strings, to a second channel potential lower than the first channel potential.

19. The method according to claim 18, wherein the at least one selected memory cell has a threshold voltage that is lowered as trapped electrons are detrapped due to a difference between the first channel potential and the potential of the first set voltage applied to the selected word line.

20. A method of operating a memory device, the method comprising:
performing a first program operation on a selected page;
performing a detrap operation on the selected page; and
performing a second program operation on the selected page, wherein the detrap operation comprises:
applying a first bit line voltage to selected bit lines corresponding to memory cells selected from among a plurality of memory cells included in the selected page, and applying a second bit line voltage lower than the first bit line voltage to an unselected bit line;
allowing channels of a plurality of memory strings respectively corresponding to the plurality of memory cells to float; and
boosting the channels of the plurality of memory strings by applying a first set voltage to a selected word line corresponding to the selected page and by applying a second set voltage having a potential higher than a potential of the first set voltage to unselected word lines corresponding to unselected pages,
wherein the first bit line voltage is a ground voltage, and the second bit line voltage is a negative voltage.

21. The method according to claim 20, wherein the first program operation is performed to program the plurality of memory cells included in the selected page such that the plurality of memory cells have a threshold voltage distribution lower than a target threshold voltage distribution.

22. The method according to claim 21, wherein the second program operation is performed to program the plurality of memory cells included in the selected page such that the plurality of memory cells have a threshold voltage distribution equal to or higher than the target threshold voltage distribution.

23. The method according to claim 20, wherein the selected memory cells are memory cells programmed to pre-program states by the first program operation, among the plurality of memory cells included in the selected page.

24. The method according to claim 20, wherein the first set voltage is a negative voltage.

25. The method according to claim 20, wherein boosting the channels of the plurality of memory strings comprises:
- boosting selected memory strings corresponding to the selected bit lines, among the plurality of memory strings, to a first channel potential; and
- boosting an unselected memory string corresponding to the unselected bit line, among the plurality of memory strings, to a second channel potential lower than the first channel potential.

26. The method according to claim 25, wherein the selected memory cells have a threshold voltage that is lowered as trapped electrons are detrapped due to a difference between the first channel potential and the potential of the first set voltage applied to the selected word line.

* * * * *